United States Patent
Pal et al.

(10) Patent No.: US 10,686,409 B2
(45) Date of Patent: Jun. 16, 2020

(54) DRAIN SWITCHED SPLIT AMPLIFIER WITH CAPACITOR SWITCHING FOR NOISE FIGURE AND ISOLATION IMPROVEMENT IN SPLIT MODE

(71) Applicant: pSemi Corporation, San Diego, CA (US)

(72) Inventors: Kashish Pal, Reading (GB); Emre Ayranci, Costa Mesa, CA (US); Miles Sanner, San Diego, CA (US)

(73) Assignee: pSemi Corporation, San Diego, CA (US)

(*) Notice: Subject to any disclaimer, the term of this patent is extended or adjusted under 35 U.S.C. 154(b) by 14 days.

(21) Appl. No.: 15/991,980

(22) Filed: May 29, 2018

(65) Prior Publication Data

US 2019/0372528 A1    Dec. 5, 2019

(51) Int. Cl.
| | |
|---|---|
| *H03F 1/14* | (2006.01) |
| *H03F 1/22* | (2006.01) |
| *H03F 3/193* | (2006.01) |
| *H03F 1/26* | (2006.01) |
| *H04L 27/26* | (2006.01) |
| *H03F 3/68* | (2006.01) |
| *H03F 1/02* | (2006.01) |

(52) U.S. Cl.
CPC .............. *H03F 1/223* (2013.01); *H03F 1/26* (2013.01); *H03F 3/193* (2013.01); *H03F 3/68* (2013.01); *H04L 27/2647* (2013.01); *H03F 1/0277* (2013.01); *H03F 2200/294* (2013.01); *H03F 2200/489* (2013.01)

(58) Field of Classification Search
CPC ... H03F 1/223; H03F 3/68; H03F 1/26; H03F 3/193; H03F 2200/294; H03F 1/0277; H03F 2200/489
USPC ............................................ 330/310, 311, 51
See application file for complete search history.

(56) References Cited

U.S. PATENT DOCUMENTS

2014/0253242 A1* 9/2014 Youssef .................... H03F 1/08
                                                          330/278

* cited by examiner

*Primary Examiner* — Khanh V Nguyen
*Assistant Examiner* — Khiem D Nguyen
(74) *Attorney, Agent, or Firm* — Jaquez Land Greenhaus LLP; Bruce W. Greenhaus, Esq.

(57) ABSTRACT

An amplifier circuit configuration capable of processing non-contiguous intra-band carrier aggregate (CA) signals using amplifiers is disclosed herein. In some cases, each of a plurality of amplifiers is an amplifier configured as a cascode (i.e., a two-stage amplifier having two transistors, the first configured as a "common source" input transistor, e.g., input field effect transistor (FET), and the second configured in a "common gate" configuration as a cascode output transistor, (e.g. cascode output FET). In other embodiments, the amplifier may have additional transistors (i.e., more than two stages and/or stacked transistors). The amplifier circuit configuration can be operated in either single mode or split mode. A switchable coupling is placed between the drain of the input FETs of each amplifier within the amplifier circuit configuration. During split mode, the coupling is added to the circuit to allow some of the signal present at the drain of each input FET to be coupled to the drain of the other input FET.

19 Claims, 13 Drawing Sheets

DRAIN SWITCHED SPLIT AMPLIFIER WITH CAPACITOR SWITCHING FOR NOISE FIGURE AND ISOLATION IMPROVEMENT IN SPLIT MODE

BACKGROUND

(1) Technical Field

Various embodiments described herein relate to amplifiers and more particularly to amplifiers for use in communications equipment.

(2) Background

The amplifiers are part of most, if not all communications equipment. In many cases, low noise amplifiers ("amplifiers") are responsible for providing the first stage amplification to a signal received within a communications receiver. The operational specifications of the amplifier are very important to the overall quality of the communications receiver. Any noise or distortion introduced by the amplifier will cause a degradation of the overall receiver performance. Accordingly, the sensitivity of a receiver is, in large part, determined by the quality of the amplifier and in particular, by the noise figure of the amplifier. In addition, amplifiers within transmitters and other communications equipment are required to be efficient, relatively linear and operate over a desired set of operating frequencies. While amplifiers that are a component of a receiver within a communication system are discussed in some detail below as one example of a particular amplifier, the discussion can be applied more generally to other types of amplifiers as well, including both amplifiers used in communications equipment generally, as well as amplifiers used in other types of equipment.

In some cases, an amplifier is required to operate over a relatively broad frequency band and to amplify signals having several distinct modulated baseband or modulated intermediate frequency (IF) signals. One example of a situation in which the amplifier is required to amplify a received signal having multiple modulated IF or baseband signals is the case in which a Non-Contiguous Intra-band (NCIB) Carrier Aggregation (CA) signal is to be received. A CA signal can have two channels (or IF carriers) having frequencies that are not adjacent to one another, but which lie within the frequency range that can be addressed by a single amplifier. For example, a CA signal may have two non-adjacent channels within a cellular frequency band defined by 3rd Generation Partnership Project (3GPP). 3GPP is a well-known industry standard setting organization.

In the case in which a receiver is required to receive a NCIB CA signal, such as a cellular telephone that is compliant with the Release 11 of the 3GPP communications industry standard, the amplifier typically amplifies the received signal and provides the amplified output signal to a passive splitter. FIG. 1 is an illustration of a portion of a cellular telephone amplifier in which an amplifier 101 is coupled to a variable attenuator 103. A bypass switch 105 allows the variable attenuator to be optionally shunted. The signal is then coupled to a single pole, three throw mode selector switch 107 that allows the output of the amplifier 101 to be selectively coupled to: (1) a first downconverter and baseband circuitry (DBC) 109; (2) a second DBC 111; or (3) both.

When the mode selector switch 107 is in the first position (i.e., Single Channel mode 1), the output of the amplifier 101 is coupled directly to the first DBC 109. In the second position (i.e., Split mode), the output of the amplifier 101 is coupled through a passive power splitter 113 to both the first and second DBC 109, 111. In the third position (i.e., Single Channel mode 2), the output of the amplifier 101 is coupled directly to the second DBC 111.

While the architecture shown in FIG. 1 is functional, there are limitations that arise from its use. The first limitation is the amount of isolation that can be achieved between the first and second DBC 109, 111. Typically, a well-manufactured 3 dB splitter can achieve approximately 18-20 dB of isolation between outputs at the center frequency for which the splitter 113 is designed to operate. Signals that are cross-coupled from one DBC to the other will typically result in interference and distortion that will result in an overall reduction in sensitivity of the receiver.

Passive splitters typically are designed to operate optimally in a relatively narrow frequency range. That is, passive splitters, by their nature are narrow band devices. As the frequency of the signal coupled through the splitter 113 deviates from the optimal frequency for which the splitter was designed, the output-to-output isolation will degrade. Due to the limitations of the splitters currently available, and because receivers that are designed to handle CA signals must operate in a relatively broad frequency range, the desired isolation between the DBCs 109, 111 is difficult to achieve.

Furthermore, power splitters such as the splitter 113 shown in FIG. 1, have significant loss. Since 3 dB power splitters split the power in half, even an ideal splitter will result in a 3 dB reduction in power presented to the DBCs 109, 111 in the Split mode compared to the Single Channel modes. In addition, most splitters will have an additional 1.0 to 1.5 dB of insertion loss. The insertion loss, like the output-to-output isolation, will typically get worse as the frequency of the signals applied deviates from the center frequency for which the splitter was designed to operate.

Still further, the losses encountered in the mode selection switch 107 and the splitter 113 lead to a need for more gain in the LNA 101. This results in reductions in linearity (as typically characterized by measuring the "third order intercept") and degradation of the noise figure of the LNA, and thus the receiver when operating in Split mode.

FIG. 2 is an illustration of an amplifier circuit configuration 200 of a communications system. Signals to be amplified are coupled through a signal input 206. In a first mode, referred to as "single mode", one of a plurality of amplifiers 202, 204 within the amplifier circuit configuration 200 is turned on. That is to say, one of two cascode output FETs 208, 212 is actively conducting current, thus allowing a signal applied to the gates of the input FETs 210, 214 of the amplifier 202, 204 to be amplified at one of the outputs of the amplifiers 202, 204. The amplified output of the active amplifier 202, 204 is coupled to an output 232, 234. The other amplifier 204, 202 is turned off (i.e., not actively amplifying the signal applied to the input of the amplifier 204, 202). In such cases, each amplifier 202, 204 comprises a pair of field effect transistors (FETs) 208, 210, and 212, 214. However, it will be understood by those skilled in the art that other types of transistors may be used, including, but not limited to, bipolar junction transistors. Furthermore, any type of FET may be used to implement the amplifier, including, but not limited to metal-oxide semiconductors (MOSFETs), junction field effect transistors (JFETs), insulated gate FETs (IGFETs), metal semiconductor FETs (MESFETs), etc.

Each pair of FETs forms a two-stage amplifier in a cascode architecture. Amplifier control signals applied to amp control inputs 216, 218 coupled to the gates of the cascode output FETs 208, 212 of the amplifier control whether each amplifier 202, 204 is on or off (i.e., amplifying or not amplifying). In some cases, an amplifier controller 217 generates the amplifier control signals based on information regarding the types of signals that will be received by the amplifier circuit configuration 200, the content carried by the signals, or based on user commands to select one or more channels. In single mode, the amplifier control signal to one of the amplifiers 202, 204 causes that amplifier to be turned on. The amplifier control signal to the other amplifier 204, 202 causes that amplifier to be turned off. In split mode, both amplifiers 202, 204 are on.

Output load matching circuits 220, 222 coupled to the output ports 224, 226 of each amplifier 202, 204 provide a means by which the output impedance of the amplifier can be matched to a load at the amplifier outputs 232, 234. In some embodiments, separate VDD supply voltage sources can be provided for each amplifier in order to increase the isolation between the amplifiers 202, 204. In other embodiments, the same source can be used to provide VDD to two or more of the amplifiers.

The amplifier circuit configuration 200 shown in FIG. 2 has advantages over the configuration shown in FIG. 1, in that the amplifier circuit configuration 200 does not require a power splitter. Therefore, the loss experienced in the prior art circuit shown in FIG. 1 due to the power splitter 113 is eliminated in the circuit shown in FIG. 2. In addition, the isolation between the first amplifier output 232 and the second amplifier output 234 is significantly better than the isolation provided by the amplifier 101 shown in FIG. 1, which uses a power splitter 113. This is because the isolation between the outputs of the amplifier 101 is only as good as the isolation between the output ports of the power splitter 113.

In contrast, the isolation achieved by the amplifier circuit configuration 200 shown in FIG. 2 is enhanced by the fact that there is significant isolation between the output port 232 of the first amplifier 202 and output port 234 of the second amplifier 204. Furthermore, the isolation provided by the splitter 113 shown in FIG. 1 will degrade as the frequency of one or both of the two channels being amplified deviates from the center frequency at which the splitter was designed to operate. Since the splitter may need to operate over a relatively broad frequency range in order to accommodate received CA signals, it will typically be designed to operate optimally at the center frequency of the frequency band of the CA signal to be received. Accordingly, when the channels of a CA signal are separated by several other channels, there will be less isolation between the outputs of the splitter. In the amplifier circuit configuration 200, the isolation between the outputs of each amplifier will improve in lower gain modes of operation.

Nonetheless, there remains an issue to be addressed when using two amplifiers in this manner. That is, the input impedance of the amplifier circuit configuration 200 will vary depending upon the mode in which the receiver is operated. In particular, the input impedance presented in single mode will be significantly different from the impedance presented in split mode. This is largely due to a difference between the gate-to-source capacitance, $C_{gs}$, of the FET transistor when the cascode output FET of the amplifier is on and the $C_{gs}$ when the cascode output FET of the amplifier is off. A large difference in input impedances will cause a large input mismatch, which in turn creates large detrimental effects on virtually every aspect of the amplifier circuit configuration 200. The effect can result in an increase in noise figure, a reduction in gain, and a degradation in linearity as, for example, measured by third order intercept (IP3). The relatively large changes in the $C_{gs}$ of the input FET 210, 214 of each amplifier 202, 204 from the conducting state to the non-conducting state result in large changes in both the real and imaginary parts of the input impedance of the amplifier circuit configuration 200 when operating in single mode versus split mode.

To assist with reducing this effect, a source switch 235 is provided that allows a connection to be either established or broken between the source of the input FET of each amplifier, depending upon whether the amplifier circuit configuration 200 is in single mode or split mode. Opening the source switch 235 during split mode improves the noise isolation between the outputs 232, 234.

However, when using the amplifier circuit configuration 200 to amplify NCIB CA signals (i.e., in split mode), the noise figure of each output referred back to the input is higher than when the amplifier circuit configuration 200 is used to amplify non-NCIB CA signals. The difference in the noise figure is due to the fact that the gates of the input FETs 210, 214 are coupled together. This provides a path for noise currents from the gate of the input FET 210, 214 in one amplifier 202, 204 to the output of the other amplifier 204, 202. Such noise can reach the output of the amplifiers 202, 204 in two ways. The first way is for gate noise voltage at the inputs of the amplifiers 202, 204 to be converted to output noise current through the transconductance $g_m$ of the input FET 214, 210. The second way is for the gate noise voltage (and the associated noise currents) to couple to the output of the amplifier 204, 202 through both the gate-to-source capacitance $C_{gs}$ and the gate-to-drain capacitance $C_{gd}$ of the input FET 214, 210 of the amplifiers 204, 202. The noise currents of all the FETs 210, 214, 208, 212 are uncorrelated. Therefore, the resulting noise current at each output of each amplifier 202, 204 is the root sum-of-square (RSS) of the noise currents contributed by all FETs at the output in each amplifier 202, 204.

The addition of the noise from one amplifier being coupled to the other, reduces the signal-to-noise ratio (SNR) at each output of the amplifier circuit configuration 200 in split mode and an associated increase in the noise figure of each amplifier 202, 204. In addition, the output-to-output isolation from the output of one amplifier to the other is reduced because they have the same coupling path. That is, in the same way the noise at the gate of each amplifier input FET 210, 214 is coupled to the output of the other amplifier 202, 204, any signal at the output of one amplifier 202, 204 will be coupled to the other amplifier 204, 202. For example, if the output of each amplifier is coupled to a different frequency conversion circuit (i.e., mixer), each having local oscillators operating at different frequencies, any local oscillator leakage through the frequency conversion circuit that appears at the output of the one amplifier 202, 204 will be coupled to the other amplifier 204, 202. The particular function for which the amplifier circuit configuration is being used will determine whether it is more important to maximize the output-to-output isolation or to minimize the noise figures of the amplifiers 202, 204 in split mode.

Since improving the noise figure and the output-to-output isolation of the amplifier circuit configuration in split mode improves the overall performance of the amplifier circuit configuration, it would be desirable to reduce the effect of unwanted signals (e.g., noise) coupling through the $C_{gs}$ and $C_{gd}$, as well as the effect of unwanted signals at the gate of the input FETs being amplified by the $g_m$ of the input FETs.

SUMMARY OF THE INVENTION

An amplifier circuit configuration capable of receiving and processing signals of various frequencies (e.g., non-contiguous intra-band carrier aggregate (CA) signals), such as an amplifier circuit configuration that uses multiple amplifiers, such as low noise amplifiers (LNAs) in some embodiments, is disclosed herein. In accordance with some embodiments of the disclosed method and apparatus, each of a plurality of amplifiers within the amplifier circuit configuration is configured as a cascode having two transistors, the first configured as a "common source" input transistor (e.g., an input field effect transistor (FET)), and the second configured in a "common gate" configuration as a cascode output transistor (e.g., a cascode output FET). In other embodiments, one or more of the amplifiers may have additional transistors (i.e., more than a single cascode arrangement and/or stacked transistors). The amplifier circuit configuration can be operated in either single mode or split mode. A switchable coupling is placed between the drain of the input FETs of each amplifier within the amplifier circuit configuration. Selectively activating the coupling of the drains of the two input FETs during split mode provides an alternate path for a non-common-mode signal present at the drain of the input FET in each amplifier to be coupled to the drain of the input FET of the other amplifier. Providing a controlled coupling between the drains of each input FET in split mode, reduces the effective noise contribution of the input FETs at their respective outputs. Furthermore, providing such a controlled coupling between the drains of the input FETs, increases the output-to-output isolation between amplifier outputs.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION OF THE INVENTION

Figure 3:
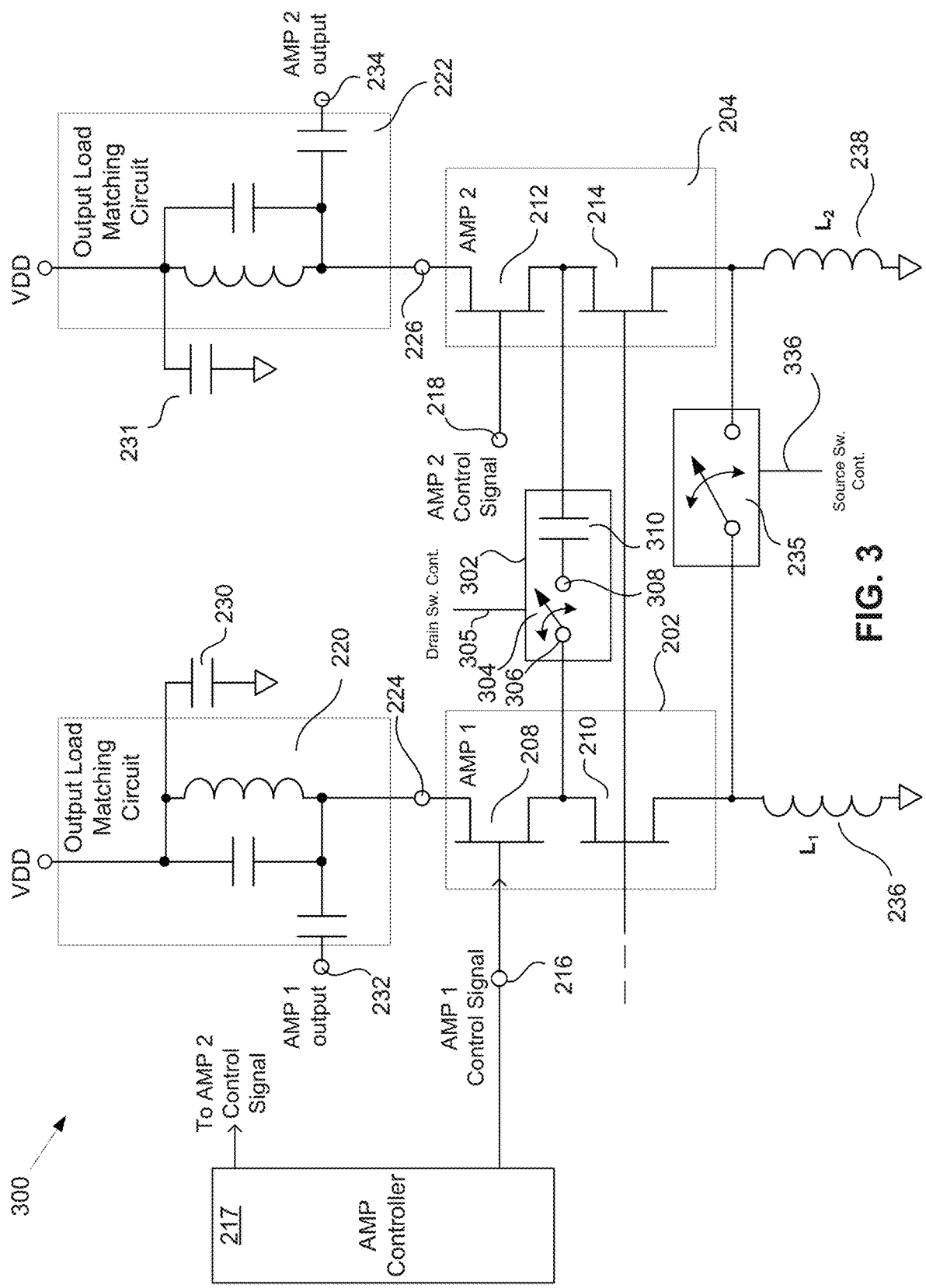
FIG. 3 is a simplified schematic of an amplifier circuit configuration configured in accordance with one embodiment of the disclosed method and apparatus.

FIG. 3 is a simplified schematic of an amplifier circuit configuration 300 configured in accordance with one embodiment of the disclosed method and apparatus. The amplifier circuit configuration 300 comprises a plurality (i.e., two are shown in FIG. 3) low noise amplifiers (LNAs 202, 204. However, each of the LNAs 202, 204 shown can be an amplifying block that is something other than an LNA. That is, as a person of ordinary skill will understand, while the amplifier circuit configuration 300 is shown in FIG. 3 to include two amplifiers 202, 204, such as might be used in a receiver of a communications system, an amplifier circuit configuration in accordance with the disclosed method and apparatus may include amplification that is designed for use in a transmitter or other such component. The amplifiers 202, 204 are provided merely as one example of amplifying blocks that make up the amplifier circuit configuration 300.

Figure 1:
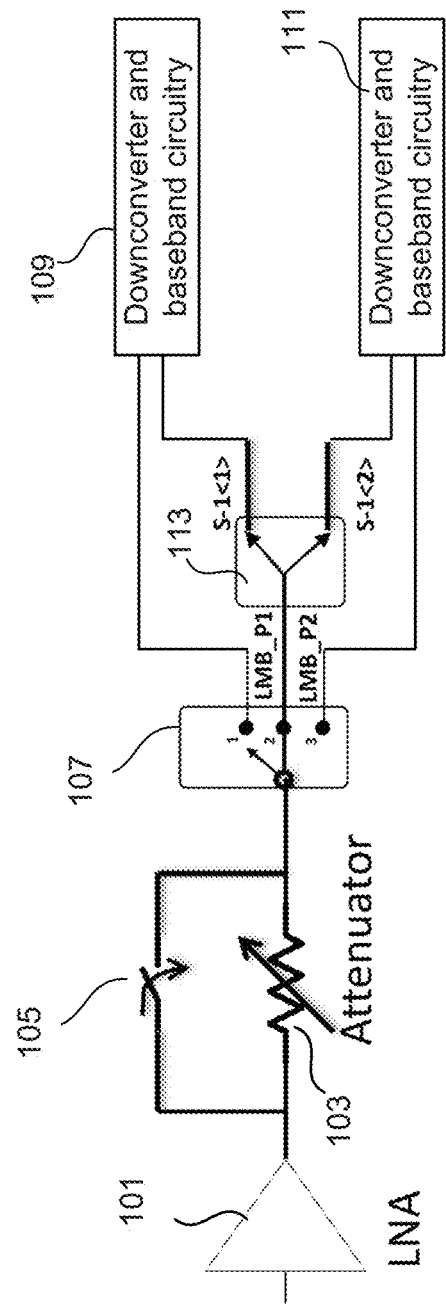
FIG. 1 is an illustration of a portion of a cellular telephone amplifier in which an amplifier is coupled to a variable attenuator.
Figure 2:
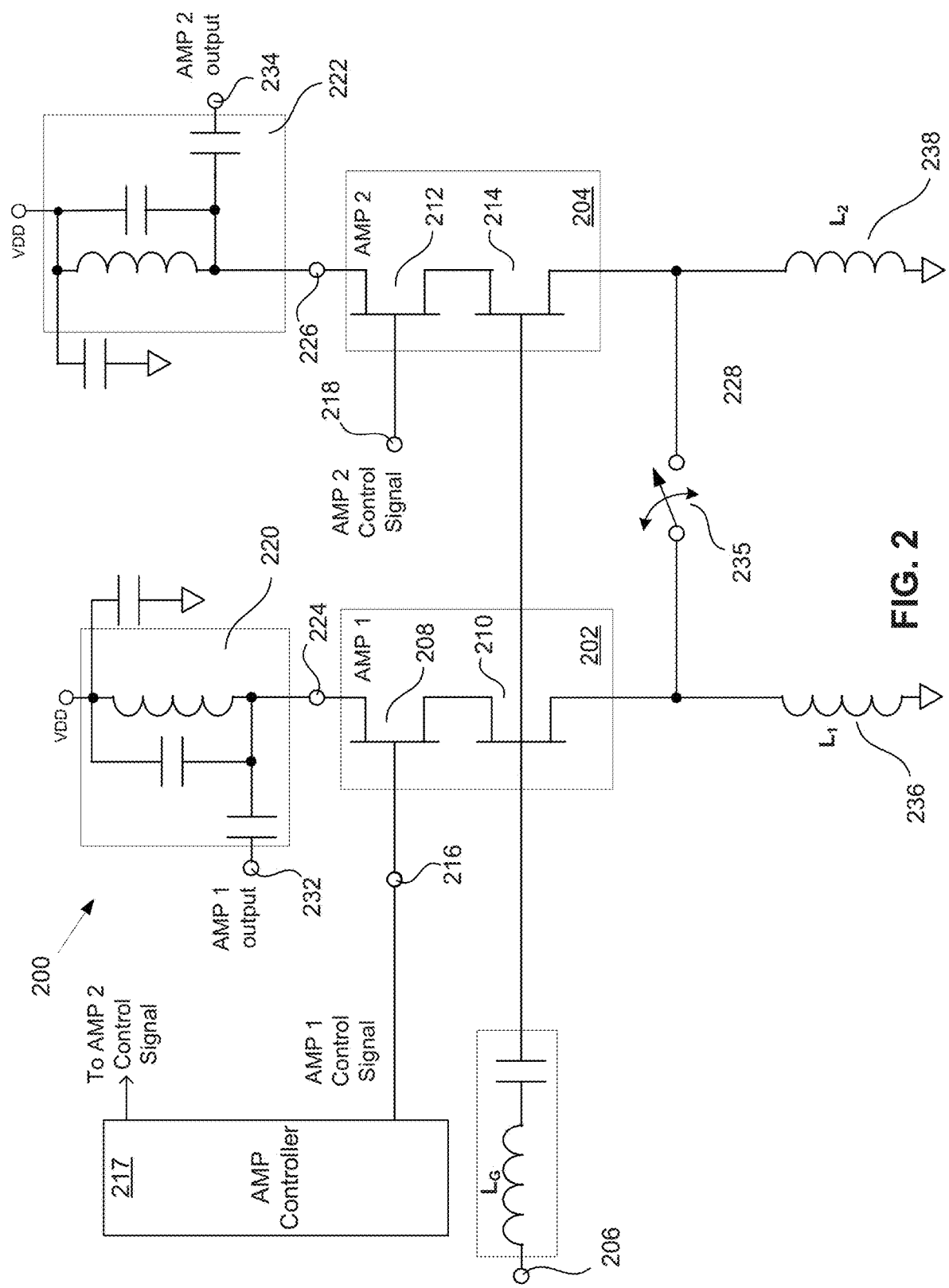
FIG. 2 is an illustration of an amplifier circuit configuration of a communications system.

As is the case in the amplifier circuit configuration 200 of FIG. 2 discussed above, the signals to be amplified by the amplifier circuit configuration 300 are coupled to the gates of the input FETs 210, 214. In single mode, as noted above, one of the amplifiers 202, 204 is turned on and the other is turned off. The amplified output of the active amplifier 202, 204 is coupled to an output 232, 234. The other amplifier 204, 202 is turned off. In some embodiments, each amplifier 202, 204 comprises a pair of field effect transistors (FETs) 208, 210, and 212, 214. However, it will be understood by those skilled in the art that other types of transistors may be used, including, but not limited to, bipolar junction transistors. Furthermore, any type of FET may be used to implement the amplifier, including, but not limited to metal-oxide semiconductors (MOSFETs), junction field effect transistors (JFETs), insulated gate FETs (IGFETs), metal semiconductor FETs (MESFETs), etc.

Each pair of FETs forms a cascode amplifier architecture. While some types of transistors may be better suited to particular applications, the concepts associated with the disclosed method and apparatus do not exclude the use of any particular type of transistor. Still further, additional transistors can be included within an amplifier either as additional cascode amplifier stages or additional stacked transistors within the cascode amplifiers other than the cascode output FETs 208, 212 that are shown. In addition, in some embodiments, the particular type of transistor and the number of such transistors can differ from one amplifier 202, 204 to another or within each amplifier 202, 204.

Amplifier control signals applied to amp control inputs 216, 218 coupled to the gates of the output transistors (e.g., FETs) of the amplifier implemented by the cascode output FETs 208, 212 control whether each amplifier 202, 204 is on or off (i.e., amplifying or not amplifying). In one embodiment, the amplifier control signals are generated by a control module, such as an amplifier controller 217. The amplifier controller 217 may generate the amplifier control signals based on information regarding the types of signals that will be received by the amplifier circuit configuration 200, the content carried by the signals, or based on user commands to select one or more channels. The amplifier controller 217 may be a general purpose processor capable of receiving commands and processing the commands to generate control signals to the amplifiers and associated switches disclosed throughout this disclosure. Alternatively, the amplifier controller 217 may be a dedicated processor specially designed for generating the control signals. Commands are received to enter a first mode, such as split mode, and determine the particular configuration of switches and amplifier control signals to be generated. In some cases, the amplifier controller 217 may be as simple as a logic block with look-up table. Alternatively, in some embodiments, the amplifier controller 217 may also rely upon additional information in determining the states of switch control and amplifier control signals. As a person of ordinary skill will understand, the amplifier controller 217 could be part of an off-chip control function.

In single mode, the amplifier control signal to one of the amplifiers 202, 204 causes that amplifier to be turned on. The amplifier control signal to the other amplifier 204, 202 causes that amplifier to be turned off. In split mode, both amplifiers 202, 204 are on. It will be understood by those skilled in the art that additional amplifiers not shown in FIG. 2 could be coupled similarly to extend the amplifier circuit configuration to select additional channels using additional modes of operation.

In some embodiments, output load matching circuits 220, 222 coupled to the output ports 224, 226 of each amplifier 202, 204 provide a means by which the output impedance can be matched to a load. In some embodiments, separate VDD supply voltage sources can be provided for each amplifier in order to increase the isolation between the amplifiers 202, 204. In other embodiments, the same source can be used to provide VDD to two or more of the amplifiers.

Figure 4:
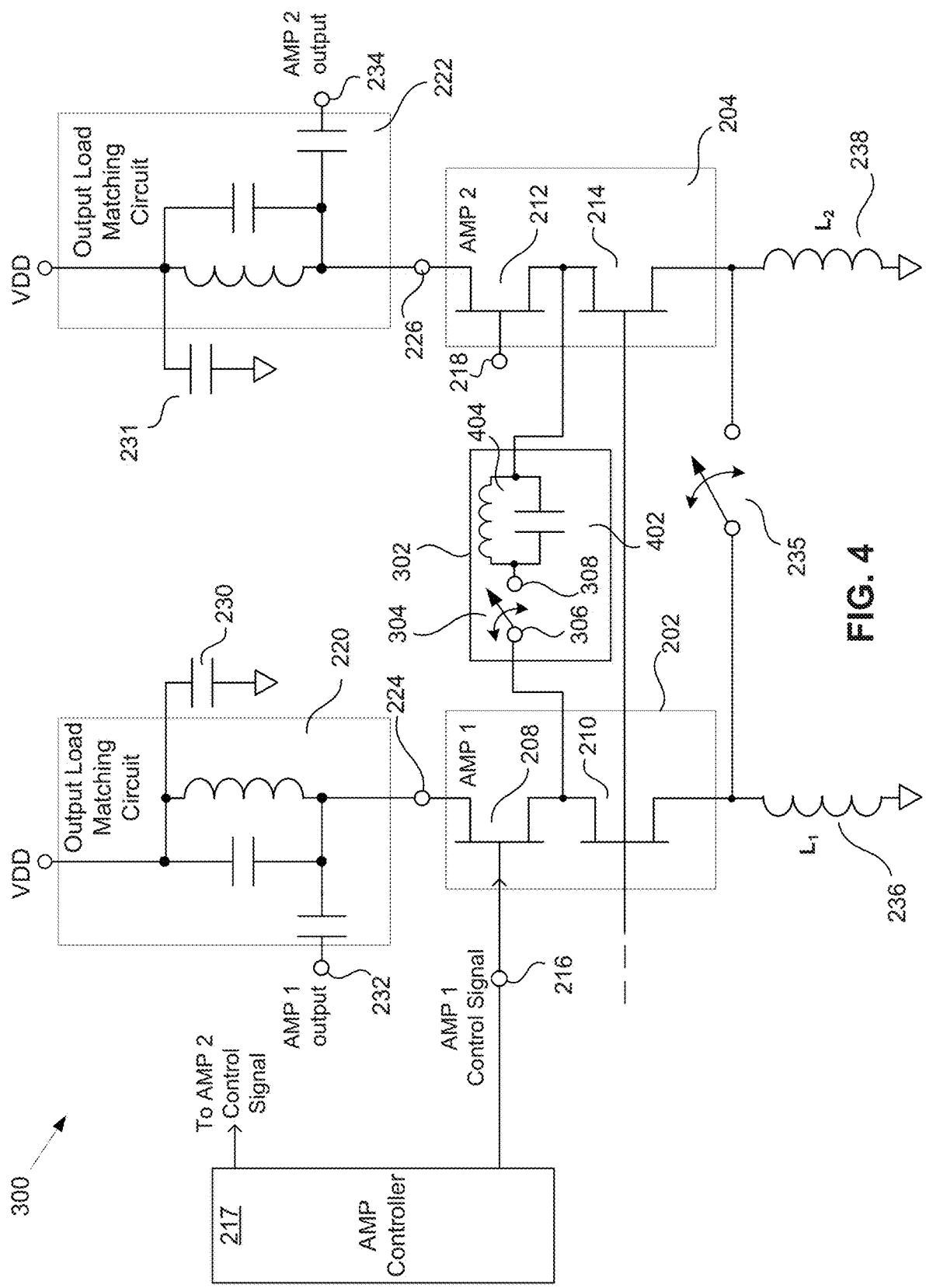
FIG. 4 is a simplified schematic of an amplifier circuit configuration in which the drain coupling includes a resonant circuit.

As show in FIG. 3, a switchable coupling 302 is coupled between the drain of the input FET 210 of one amplifier 202 and the drain of the input FET 214 of the other amplifier 204. In accordance with one embodiment of the disclosed method and apparatus, the coupling 302 comprises a single pole, single throw (SPST) coupling switch 304. A first switch terminal 306 is coupled to the drain of the input FET 210 of the first amplifier 202. A second switch terminal 308 is coupled to an impedance (e.g., reactive element, such as a coupling capacitor 310). In one embodiment, the coupling capacitor 310 is coupled between the second terminal 308 of the coupling switch 304 and the drain of the input FET 214 of the second amplifier 204. In other embodiments, depending upon the nature of amplifier 202, 204 (which may be other than the amplifiers 202, 204 shown in FIG. 3), the coupling capacitor 310 of the coupling 302 can be replaced by coupling 402 having a different impedance component, such as an inductor (not shown) or a purely resistive component (not shown). FIG. 4 is a simplified schematic of an amplifier circuit configuration 400 in which the drain coupling 402 includes a resonant circuit 404. In some embodiments, the coupling switch 304 has a coupling sw. control input 305 that allows the coupling switch 304 to be controlled by the amplifier controller 217. Similarly, in some embodiments, the source switch 235 has a source sw. control input 336 that allows the source switch 235 to be controlled by the amplifier controller 217. Accordingly, the amplifier controller 217 can coordinate the state of each switch 235, 304 with the particular amplifier circuit configuration modes of operation, such as single mode and split mode.

The following is a discussion of the mitigating effects of the coupling 302, 402 on a non-common-mode signal (including but not limited to noise) present at the drain of the first input FET 210 of the first amplifier 202 that can be coupled to the second amplifier 204. The coupling 302, 402 introduces a path for part of the signal to flow from the drain of the input FET 210 to the drain of the input FET 214 with a different phase shift than the part that flows through the gate capacitors of the input FETs 210, 214. For example, without the coupling 302, noise voltage at the gate of the input FET 214 directly results in noise current at the drain of the input FET 214. In addition, noise currents can flow from the gate of the input FETs 210, 214 to the drain of the input FET 214 through the gate-to-drain capacitance, $C_{gd}$, of each of the input FETs 210, 214, as well as through the gate-to-source capacitance, $C_{gs}$ of the input FETs 210, 214.

With the coupling switch 304 closed, the noise current generated at the drain of the input FET 210 can be coupled by coupling capacitor 310 from the drain of the input FET 210 to the drain of the FET 214 and vice versa. During split mode, currents flow through the gate-to-drain capacitance (i.e., $C_{gd}$ of the input FET 210). By closing the coupling switch 304, these currents that would otherwise end up creating a voltage at the gates of the input FETs 210, 214, have an additional path through the coupling 302, 402. By selecting a desired value of the capacitance 310, the phase and amplitude of the total noise current at the drain of the input FET 214 can be modified depending on the current coupled through the coupling 302 during split mode. The presence of the alternate path through 304, therefore, can be employed to reduce the contribution of the noise generated by 210 at the output 232.

It should be noted that the effect of the coupling 302, 402 is complicated by the fact that coupling the drains of the two input FETs 210, 214 may reduce the isolation between the first amplifier 202 and the second amplifier 204. This is especially true for larger values of capacitance in the coupling 302, 402. However, proper selection of the impedance of the coupling 302, 402 can result in an improvement in both the noise figure of the two amplifiers 202, 204 and in the output-to-output isolation between the two amplifiers 202, 204. The proper value of the coupling can be determined for the particular amplifier circuit configuration at issue by simulation, design experience or trial and error. The impact of the phase shift of the signals coupled through the coupling 302, 402 results in a net increase in the isolation between the drains of the input FETs 210, 214 for certain values of impedance in the coupling 302, 402.

Figure 5:
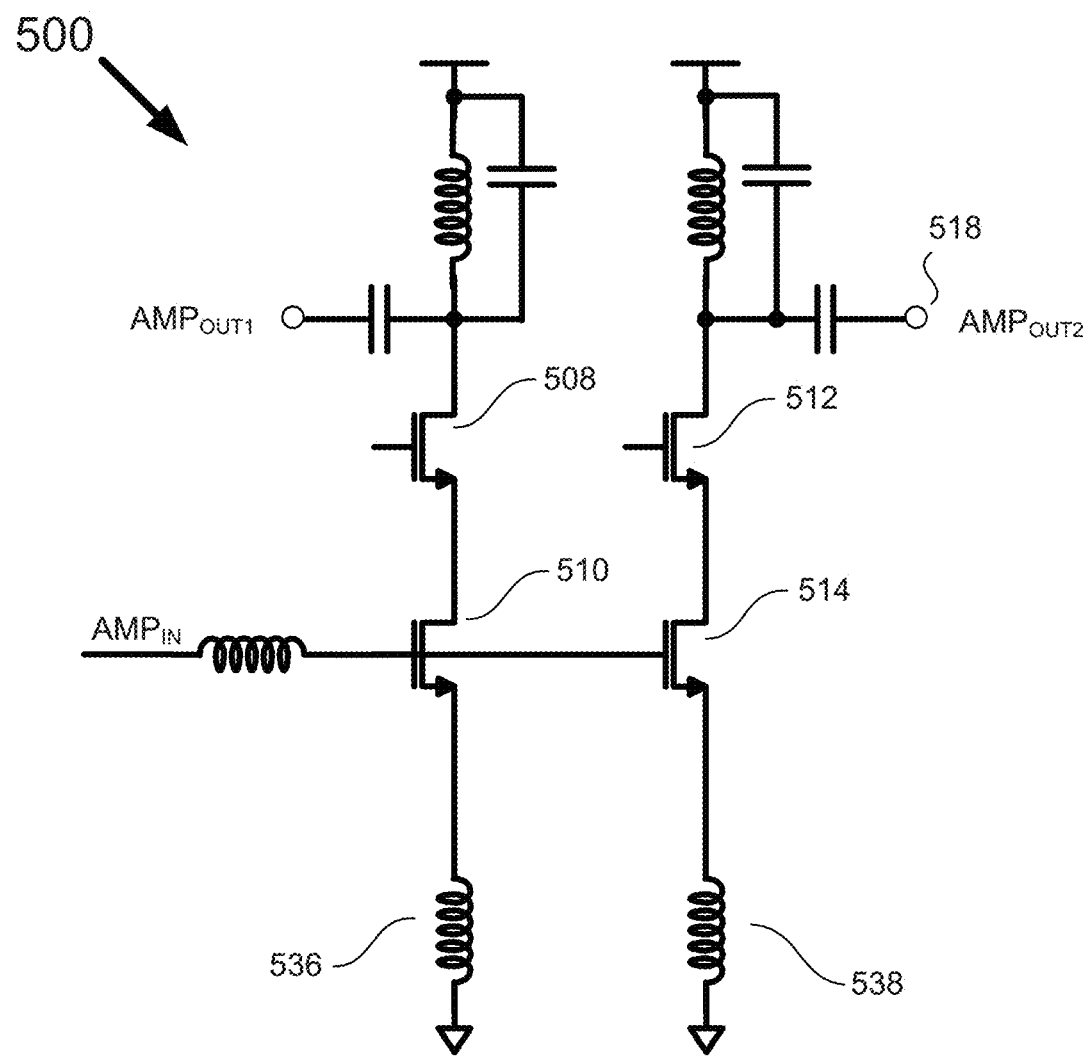
FIG. 5 is an illustration of a first simulated amplifier circuit configuration on which a simulation was run to determine the noise contribution of each FET at one output of a source split amplifier circuit configuration operating in split mode.

FIG. 5 is an illustration of a first simulated amplifier circuit configuration 500 on which a simulation was run to determine the noise contribution of each FET 508, 510, 512, 514 at one output 518 of a source split amplifier circuit configuration operating in split mode, such as the amplifier circuit configuration 200. The simulated amplifier circuit configuration 500 does not have a drain coupling. In addition, the gates of the two input FETs 510, 514 of the simulated amplifier circuit configuration 500 are coupled together, in similar fashion to the amplifier circuit configuration 200 shown in FIG. 2 when operating in split mode (i.e., with the source switch 235 open). Furthermore, degeneration inductors 536, 538 are connected to respective sources of the two input FETs 510, 514, similar to the amplifier circuit configuration 200 operating in split mode.

Figure 6:
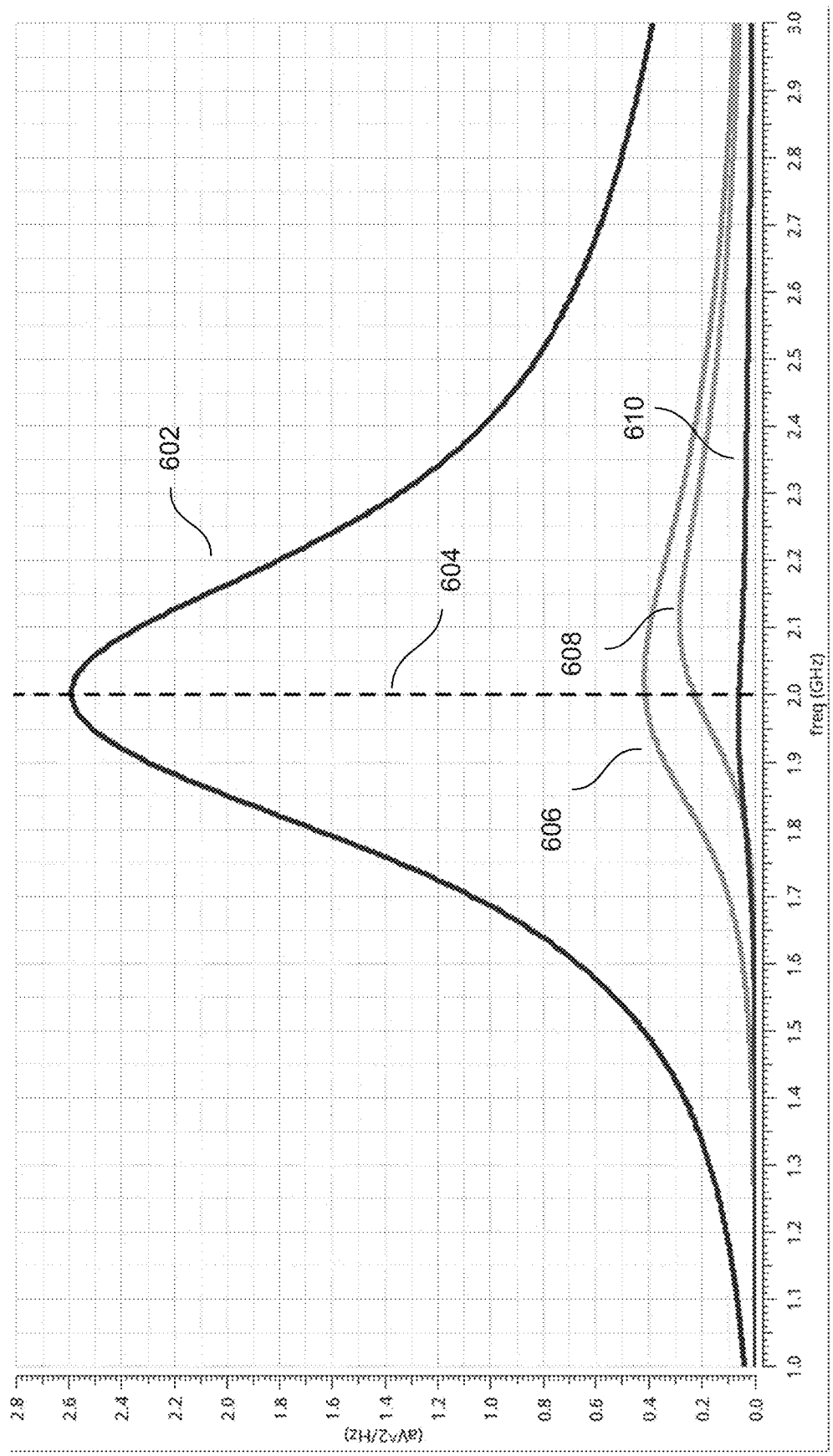
FIG. 6 is a graph of the relative noise contribution of each FET.

FIG. 6 is a graph of the relative noise contribution of each FET 508, 510, 512, 514. A first curve 602 shows the contribution of FET 514. The greatest contribution is made by the input FET 514 at the center frequency (indicated by the dotted line 604). As shown, the contribution of the input FET 514 is 2.6 aV$^2$/Hz at 2.0 GHz. A second curve 606 shows the contribution made by the cascode output FET 512. The contribution of the cascode output FET 512 peaks at approximately 0.42 aV$^2$/Hz at 2.0 GHz. A third curve 608 shows the contribution made by the input FET 510. The contribution of the input FET 510 is 0.23 aV$^2$/Hz at 2.0 GHz and peaks at 0.2 aV$^2$/Hz at 2.1 GHz. A fourth curve 610 shows the contribution made by the cascode output FET 508. The contribution of the cascode output FET 508 is approximately 0.07 aV$^2$/Hz at 2.0 GHz.

Figure 7:
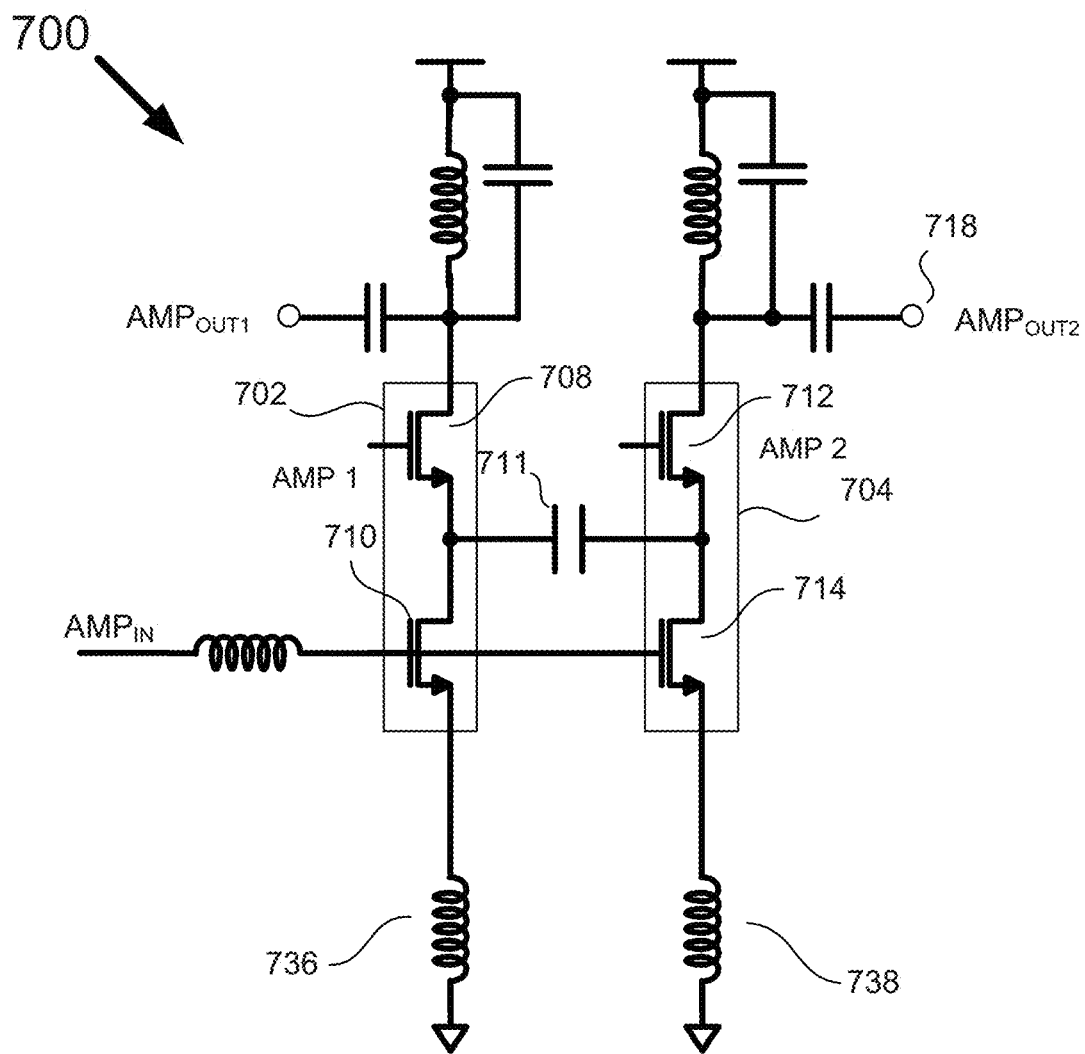
FIG. 7 is an illustration of a second simulated amplifier circuit configuration on which a simulation was run to determine the noise contribution of each FET at one output of a source split amplifier circuit configuration operating in split mode, such as the amplifier circuit configuration of FIG. 3.

FIG. 7 is an illustration of a second simulated amplifier circuit configuration 700 on which a simulation was run to determine the noise contribution of each FET 708, 710, 712, 714 at one output 718 of a source split amplifier circuit configuration operating in split mode, such as the amplifier circuit configuration 300 of FIG. 3. The simulated amplifier circuit configuration 700 has a drain coupling comprising a coupling capacitor 711. In addition, the gates of the two input FETs 710, 714 of the simulated amplifier circuit configuration 700 are coupled together, in similar fashion to the amplifier circuit configuration 300 when operating in split mode (i.e., with the source switch 235 closed). Furthermore, degeneration inductors 736, 738 of the simulation are connected to respective sources of the two input FETs 710, 714, similar to the degeneration inductors 236, 238 of the amplifier circuit configuration 300 operating in split mode.

Figure 8:
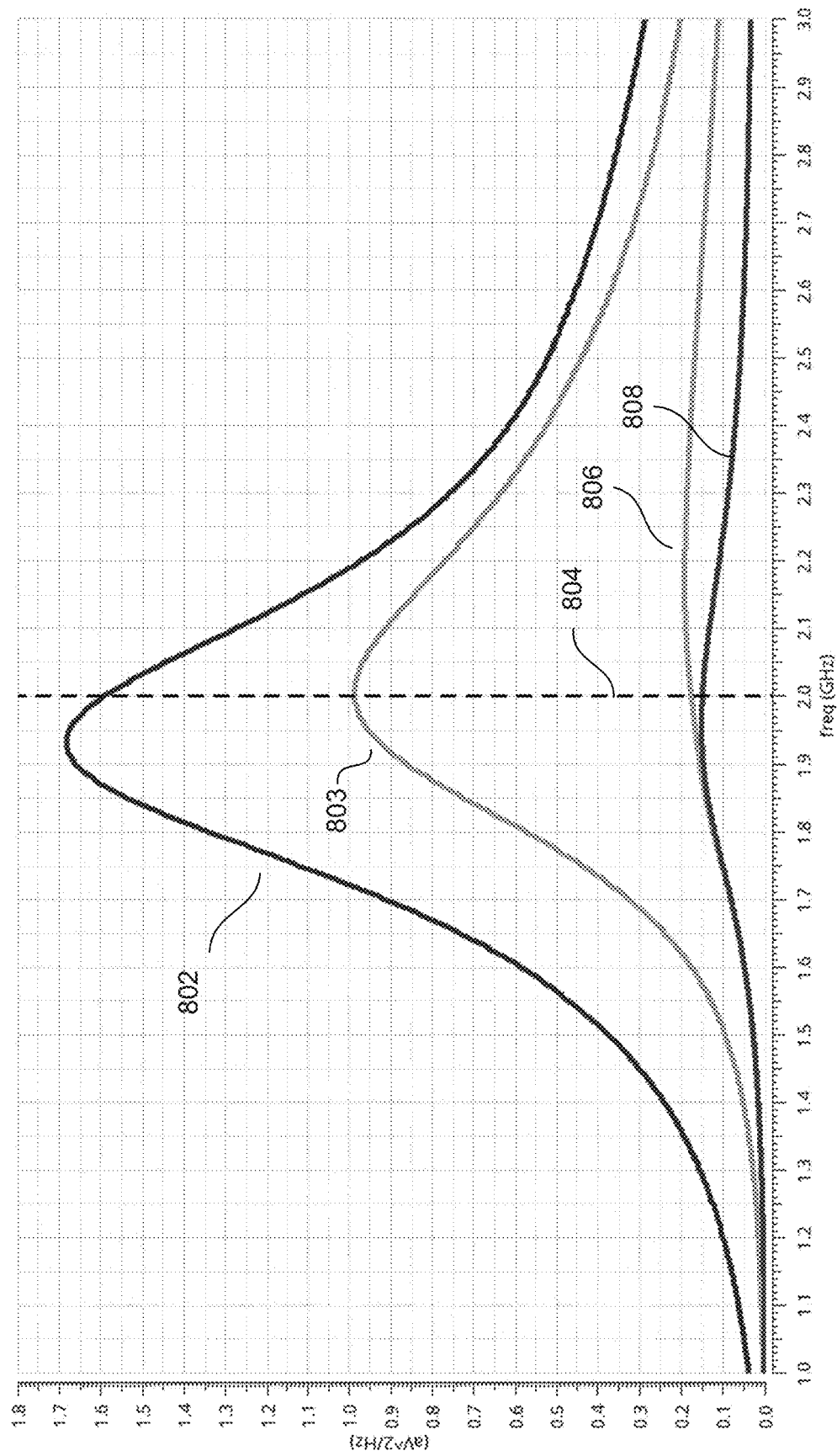
FIG. 8 is a graph of the relative noise contribution of each FET.

FIG. 8 is a graph of the relative noise contribution of each FET 708, 710, 712, 714. A first curve 802 shows that the greatest contribution is still made by the input FET 714 at the center frequency (indicated by the dotted line 804). However, the contribution of the input FET 714 is approximately 1.6 aV$^2$/Hz at 2.0 GHz. It can be seen that the peak of the curve 802 occurs at approximately 1.925 GHz, rather than at the center frequency. The contribution of the cascode output FET 712 peaks at approximately 1.0 aV$^2$/Hz at 2.0 GHz. The curve 803 shows the contribution of the FET 712. Accordingly, it is substantially greater than the contribution of the cascode output FET 512 of the simulated amplifier circuit configuration 500. However, the sum of the noise contributions for the simulated amplifier circuit configuration 700 at the center frequency (2.0 GHz) is still less than sum of the noise contributions of the cascode output FET 712 for the simulated amplifier circuit configuration 700. The curve 806 shows the contribution of the input FET 710. The contribution of the input FET 710 is 0.175 aV$^2$/Hz at 2.0 GHz and peaks at 0.2 aV$^2$/Hz at 2.15 GHz. The contribution of the input FET 708 is approximately 0.15 aV$^2$/Hz at 2.0 GHz as show by curve 808.

The main effects of the addition of the drain coupling to the amplifier circuit configuration 700 are the shift to a lower frequency in the dominant noise peak of the curve 802 representing the noise contribution of the input FET 714. In addition, there is a concurrent rise in the noise contribution of the other FETs 710, 712, 708. Nonetheless, the total noise contribution in the amplifier circuit configuration 700 without the drain coupling, taking all of the four FETs into account is equal to:

$$\text{NoiseTotal} = \sqrt{2.6^2 + 0.4^2 + 0.25^2 + 0.075^2} = 2.65 \text{ (no drain coupling)}$$

In contrast, the total noise contribution in the amplifier circuit configuration 500 with the drain coupling, taking all of the four FETs into account is equal to:

$$\text{NoiseTotal} = \sqrt{1.6^2 + 1.0^2 + 0.175^2 + 0.15^2} = 1.9 \text{ (with drain coupling)}$$

As noted above, selective noise shaping can be performed by changing the impedance of the drain coupling to alter the contributions of each of the FETs to the overall noise content at the output of the amplifier circuit configuration. In addition, since the phase of the noise that is combined will shift as a consequence of the particular impedance of the drain coupling, the frequency at which the contribution of each FET will peak will also shift. Tradeoffs can be made to match performance of the amplifier circuit configuration to the particular requirements and desired performance associated with the environment in which the amplifier circuit configuration is to be used. In particular, the noise peak can be shifted away from the center frequency by selective noise shaping performed through the selection of the impedance of the drain coupling. In addition, the output-to-output isolation between the two amplifiers 202, 204 of the amplifier circuit configuration 300, 400 can be selectively tuned through the selection of the impedance of the drain coupling. Since the impedance of the drain coupling affects both amplifiers equally, the impact on the gain of each is negligible, assuming the two amplifiers 202, 204 are symmetrical.

Figure 9:
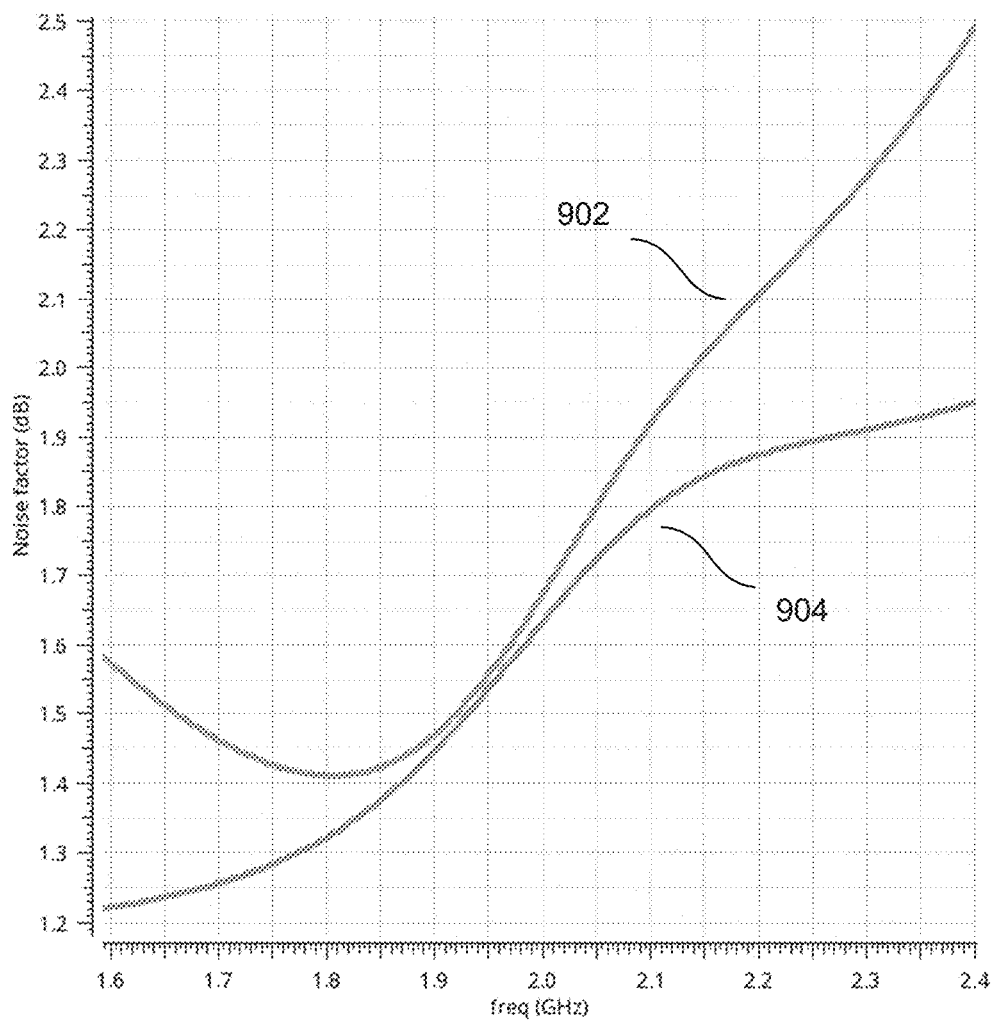
FIG. 9 is a graph of the noise figure for a simulated amplifier circuit configuration without a drain coupling.

FIG. 9 is a graph of the noise figure for a simulated amplifier circuit configuration 500 without a drain coupling. A first curve 902 shows a typical noise figure for a simulated amplifier circuit configuration 500. A second curve 904 shows the minimum noise figure for such a simulated amplifier circuit configuration 500 for a perfect noise match. The typical noise figure at the center frequency of 2.0 GHz is approximately 1.7 dB. The minimum noise figure for that amplifier circuit configuration 500 is approximately 1.65 dB at the center frequency.

Figure 10:
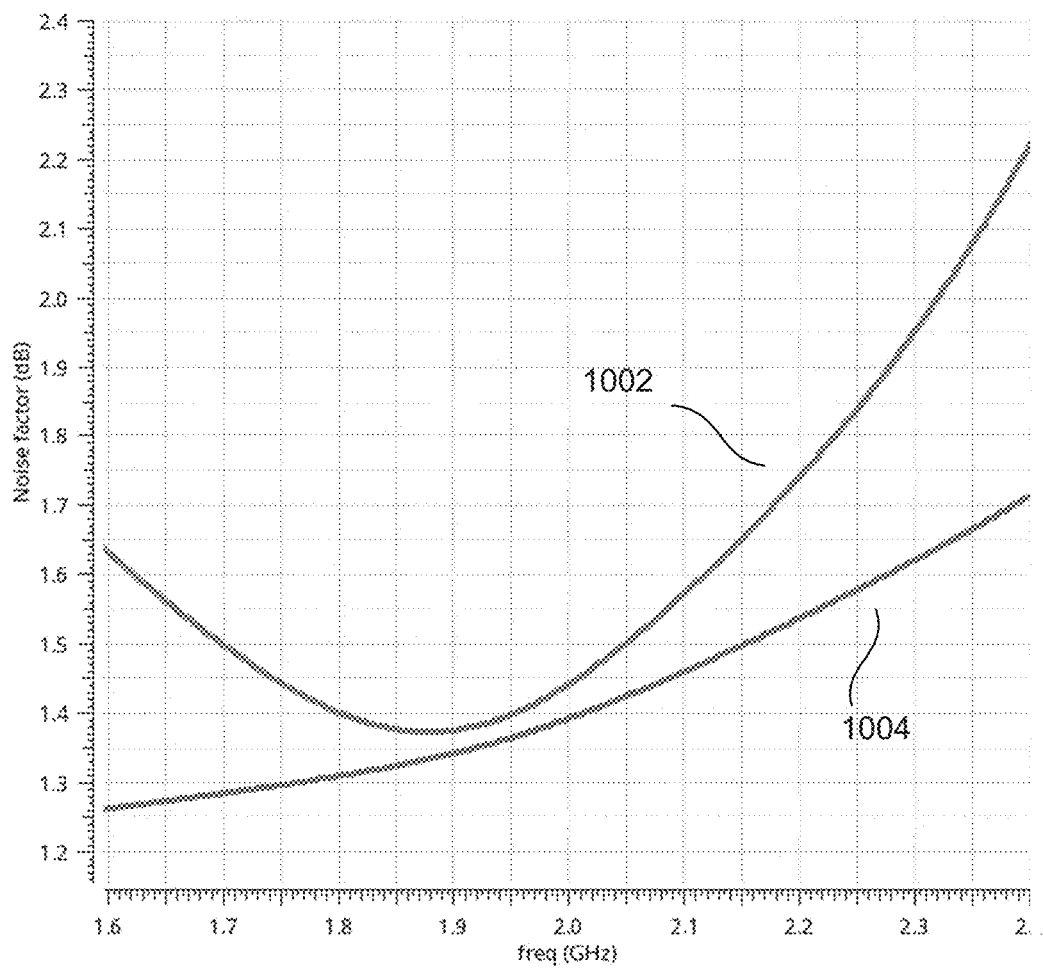
FIG. 10 is a graph of the noise figure for a simulated amplifier circuit configuration that has a drain coupling.

FIG. 10 is a graph of the noise figure for a simulated amplifier circuit configuration 700 that has a drain coupling 711. The typical noise figure as shown by a first curve 1002 in FIG. 10 is approximately 1.45 dB for a simulated amplifier circuit configuration 700 having a drain coupling 711 and the minimum noise figure for the amplifier circuit configuration 700 is approximately 1.4 dB. Accordingly, the improvement in the noise figure at the center frequency is approximately 0.25 dB. Even greater improvements occur at the higher frequencies in the band of interest.

Since the signal that is amplified by each amplifier 702, 704 of the simulated is the same due to the coupling of their inputs at the gates of the input FETs 710, 714, the gain of the two amplifiers will be unaffected by the drain coupling, since the effect of the drain coupling on the signal will be a common mode effect. That is, since the desired signal present at each drain is the same by nature of the amplifier circuit configuration having the same input, there is no net change in the operation of either of the amplifiers as a consequence of coupling the drains of the input FETs 710, 714.

Figure 11:
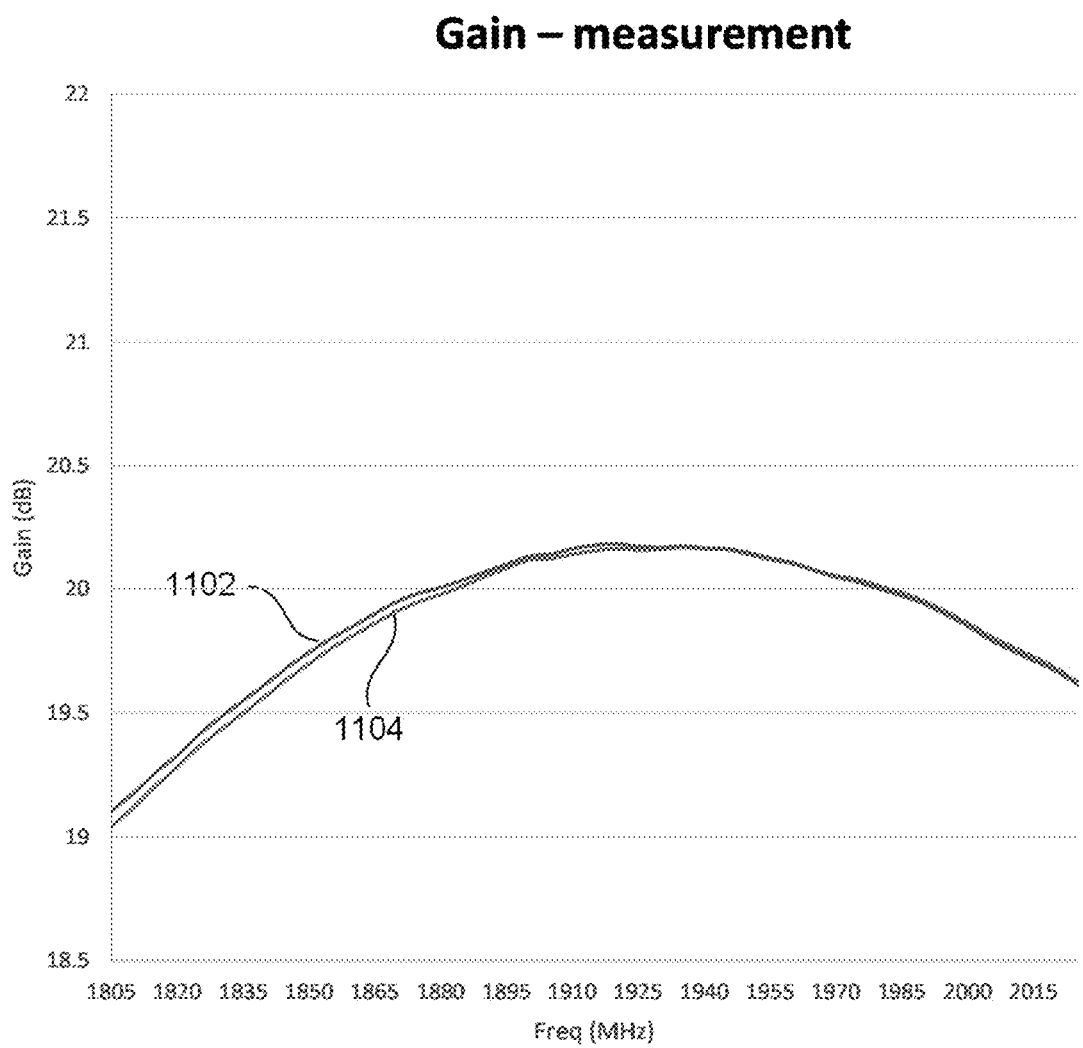
FIG. 11 is a graph having a first curve showing the gain of a simulated amplifier circuit configuration without a drain coupling, and a second curve showing the gain of a simulated amplifier circuit configuration that has a drain coupling.

FIG. 11 is a graph having a first curve 1102 showing the gain of a simulated amplifier circuit configuration 500 without a drain coupling, and a second curve 1104 showing the gain of a simulated amplifier circuit configuration 700 that has a drain coupling. The gain of each amplifier circuit configuration 500, 700 is essentially the same over the frequency range shown.

Figure 12:
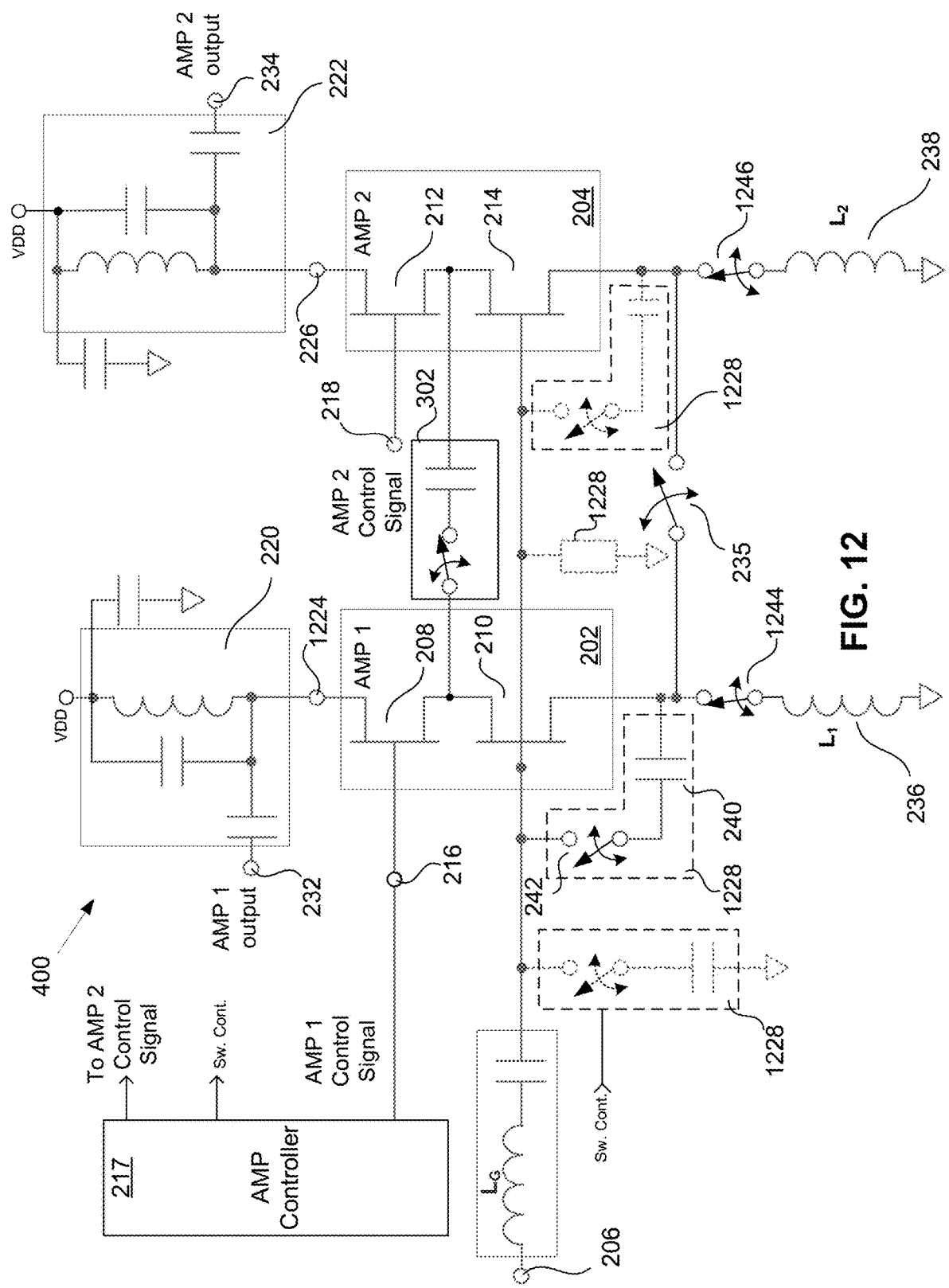
FIG. 12 is a simplified schematic of an amplifier circuit configuration having a drain coupling and also having various switched impedance circuits (SICs).

FIG. 12 is a simplified schematic of an amplifier circuit configuration 1200 having a source switch 235 and a drain coupling 302 and also having various switched impedance circuits (SICs) 1228. The SICs 1228 include a gate switch 242 and a gate capacitor 240 which provide a switchable gate-to-source and/or gate-to-ground gate capacitor to be selectively coupled to the input FET of at least one of the amplifiers 202, 204. Each of the SICs 1228 has a switch control input that, in some embodiments, is coupled to a switch control output of the amplifier controller 217. In some embodiments, degeneration switches 1246, 1244 are provided to disconnect one of the degeneration inductors 236, 238 from the source of an input FET 210, 214 of an amplifier 202, 204 when the source switch 235 is closed. In some embodiments, each of the degeneration switches 1244, 1246 has a degeneration sw. control input coupled to a degeneration sw. output at the amplifier controller 217. Coordinating the operation of these switches 1244, 1246, the SICs 1228, the source switch 235 and the drain coupling 302 with the mode of the amplifier circuit configuration 1200 ensures that the input impedance to the amplifier circuit configuration remains essentially the same in both single mode and in split mode. That is, activating the source switch 235 allows the two amplifiers 202, 204 to operate with the sources of their respective input FETs 210, 214 coupled together during single mode and to be split apart during split mode. The activation of the other switches provides a more consistent input impedance between modes, a more consistent noise figure and greater output isolation between the outputs 216, 218 of the amplifier circuit configuration 1200.

Methods

Figure 13:
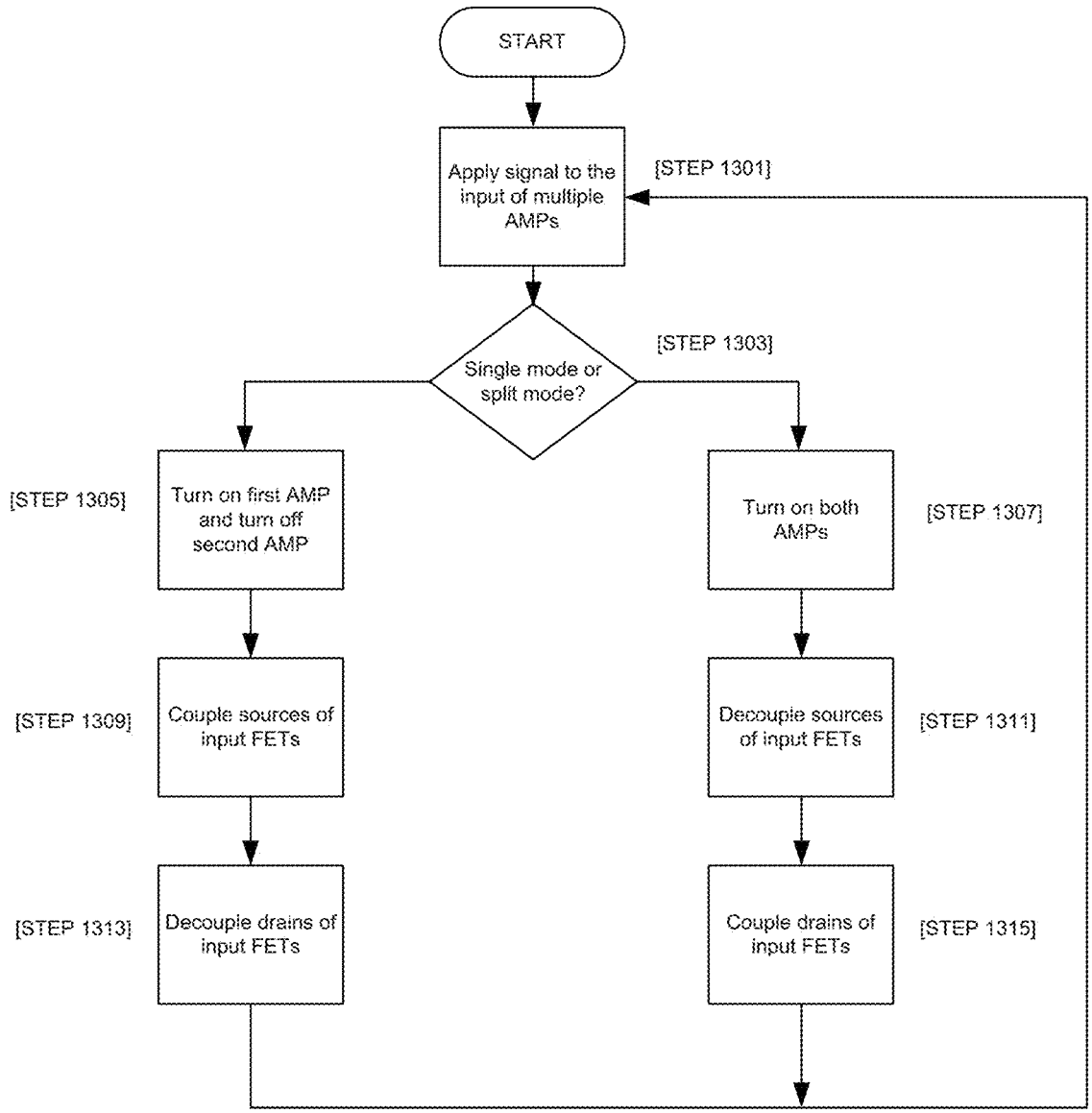
FIG. 13 is an illustration of a method in accordance with one embodiment for amplifying a signal (e.g., a CA signal) using more than one amplifier.

FIG. 13 is an illustration of a method in accordance with one embodiment for amplifying a signal (e.g., a CA signal) using more than one amplifier. The signal is applied to the input of the amplifiers [STEP 1301]. In some embodiments, the signal includes a first and a second non-adjacent channel. The first and second channels are considered to be non-adjacent if there is at least a narrow frequency range between the defined end of the frequency range of the first channel and the defined beginning of the frequency range of the second channel. Typically, at least a third channel is defined within the frequency range between the end of the first and beginning of the second channel. The frequency range of a channel is typically defined by industry standards, but in some cases may be defined by the 3 dB frequency range of filters commonly used to receive signals transmitted over the channel.

The method further includes selecting between a single mode or a split mode [STEP 1303]. In one embodiment, the selection between single mode and split mode is made by turning on a first amplifier 202 and turning off a second amplifier 204 to select single mode [STEP 1305]. In one such embodiment, the first amplifier 202 is turned on by applying an amplifier control signal to a first control input 216 coupled to the gate of a cascode output FET, such as the cascode output FET 208 shown in FIGS. 2-5. The second amplifier 204 is turned off by applying an amplifier control signal to a second control input 218. Similarly, the selection of split mode is made by applying amplifier control signals to the amp control inputs 216, 218 to turn both amplifiers 202, 204 on [STEP 1307].

The method further includes coupling the source of an input FET of the first amplifier 202, such as input FET 210 and the source of an input FET of the second amplifier 204, such as the input FET 214, during single mode [STEP 1309] and decoupling the two sources during split mode [STEP 1311]. In one such embodiment, a source switch 235 is closed in single mode and opened in split mode. When closed, the source switch 235 couples the two sources of the input FETs 210, 214. In addition, a drain coupling switch is opened during single mode [STEP 1313] and closed [STEP 1315] during split mode.

Fabrication Technologies and Options

As should be readily apparent to one of ordinary skill in the art, various embodiments of the claimed invention can be implemented to meet a wide variety of specifications. Unless otherwise noted above, selection of suitable component values is a matter of design choice and various embodiments of the claimed invention may be implemented in any suitable IC technology (including but not limited to MOSFET and IGFET structures), or in hybrid or discrete circuit forms. Integrated circuit embodiments may be fabricated using any suitable substrates and processes, including but not limited to standard bulk silicon, silicon-on-insulator (SOI), silicon-on-sapphire (SOS), GaN HEMT, GaAs pHEMT, and MESFET technologies. However, in some cases, the inventive concepts claimed may be particularly useful with an SOI-based fabrication process (including SOS), and with fabrication processes having similar characteristics.

A number of embodiments of the claimed invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion. It is to be understood that the foregoing description is intended to illustrate and not to limit the scope of the claimed invention, which is defined by the scope of the following claims, and that other embodiments are within the scope of the claims.

What is claimed is:

1. An amplifier circuit configuration comprising:
  (a) a plurality of amplifiers, each including an input transistor and a cascode output transistor;
  (b) at least two amp control inputs, each coupled to the cascode output transistor of a corresponding one of the amplifiers; and
  (c) at least one switchable drain coupling coupled between drains of input transistors connecting drain terminals of the input transistors of at least two of the amplifiers during the second mode of operation and disconnecting the drain terminals during the first mode of operation;
  (d) at least one source switch connecting source terminals of the input transistors of at least two of the amplifiers during a first mode of operation and disconnecting the source terminals during at least a second mode of operation.

2. The amplifier circuit configuration of claim 1, wherein the drain coupling includes at least an impedance in series with a switch.

3. The amplifier circuit configuration of claim 1, further comprising an amplifier controller coupled to the amp control inputs, to the at least one source switch and to the switchable drain coupling.

4. The amplifier circuit configuration of claim 1, wherein the drain coupling includes at least a coupling capacitor coupled in series with a switch.

5. The amplifier circuit configuration of claim 2, wherein the impedance is established by a resonant circuit.

6. The amplifier circuit configuration of claim 1, further comprising at least a first switched impedance circuit (SIC), the first SIC having a first and second terminal, the first terminal coupled to the gate of an associated one of the input transistors and the second terminal coupled to the source of the associated input transistor.

7. The amplifier circuit configuration of claim 6, further comprising at least one additional SIC, each additional SIC having a first and second terminal, the first terminal coupled to the gate of an associated one of the input transistors and the second terminal coupled to the source of the associated input transistor.

8. The amplifier circuit configuration of claim 6, further comprising an amplifier controller having at least one switch control output, wherein each SIC has a switch control input to which a corresponding switch control output is coupled, the amplifier controller further has at least a first and second amplifier control signal output coupled to corresponding ones of the at least two amp control inputs and having at least a drain coupling control output coupled to the drain coupling and a source switch control output coupled to the source switch.

9. The amplifier circuit configuration of claim 6, wherein at least one of the SICs includes a gate capacitor and a gate switch coupled in series between the first terminal and the second terminal of the SIC.

10. The amplifier circuit configuration of claim 1, further comprising at least one SIC, each SIC a first and second terminal, the first terminal coupled to the gate of an associated one of the input transistors and the second terminal coupled to ground.

11. The amplifier circuit configuration of claim 10, further comprising an amplifier controller having at least one switch control output, wherein each SIC has a switch control input to which a corresponding switch control output is coupled.

12. The amplifier circuit configuration of claim 10, wherein each SIC includes a gate capacitor and a gate switch coupled in series between the first terminal and the second terminal of the SIC.

13. The amplifier circuit configuration of claim 1, further comprising:
  (a) a degeneration component; and
  (b) a degeneration switch coupled in series with the degeneration component, the series combination of the degeneration component and degeneration switch coupled between the source of one of the input transistors and circuit ground.

14. The amplifier circuit configuration of claim 13, wherein the degeneration component is an inductor.

15. The amplifier circuit configuration of claim 13, wherein the degeneration switch is open when the source switch is closed and closed when the source switch is open.

16. The amplifier circuit configuration of claim 13, further comprising at least a second degeneration component and a second degeneration switch.

17. The amplifier circuit configuration of claim 6, further comprising:
  (a) a degeneration component; and
  (b) a degeneration switch coupled in series with the degeneration component, the series combination of the degeneration component and degeneration switch coupled between the source of one of the input transistors and ground.

18. The amplifier circuit configuration of claim 17, further comprising at least a second degeneration inductor and a second degeneration switch,
  wherein each SIC includes a gate capacitor and a gate switch coupled in series between the first terminal and the second terminal of the SIC, and
  wherein the second degeneration inductor and second degeneration switch are coupled in series between the source of a second input transistor and ground.

19. The amplifier circuit configuration of claim 17, further comprising a control module having switch control outputs, wherein the degeneration switch has a switch control input to which one of the switch control outputs is coupled and each SIC has a switch control input to which one of the switch control outputs is coupled.

* * * * *